US008228114B1

(12) United States Patent
Cilio

(10) Patent No.: US 8,228,114 B1
(45) Date of Patent: Jul. 24, 2012

(54) NORMALLY-OFF D-MODE DRIVEN DIRECT DRIVE CASCODE

(75) Inventor: Edgar Cilio, Farmington, AR (US)

(73) Assignee: Arkansas Power Electronics International, Inc., Fayetteville, AR (US)

( * ) Notice: Subject to any disclaimer, the term of this patent is extended or adjusted under 35 U.S.C. 154(b) by 0 days.

(21) Appl. No.: 12/924,622

(22) Filed: Sep. 30, 2010

Related U.S. Application Data

(60) Provisional application No. 61/277,869, filed on Sep. 30, 2009.

(51) Int. Cl.
*H03K 17/687* (2006.01)
*H03K 17/16* (2006.01)

(52) U.S. Cl. ........................................ 327/430

(58) Field of Classification Search ............... 327/430, 327/431
See application file for complete search history.

(56) References Cited

U.S. PATENT DOCUMENTS

| | | | |
|---|---|---|---|
| 6,614,281 B1 | 9/2003 | Baudelot et al. | 327/321 |
| 7,233,191 B2 * | 6/2007 | Wang et al. | 327/430 |
| 7,535,032 B2 * | 5/2009 | Tai et al. | 257/134 |
| 7,719,055 B1 | 5/2010 | McNutt et al. | 257/341 |
| 7,746,156 B1 * | 6/2010 | Massie et al. | 327/427 |
| 7,777,553 B2 * | 8/2010 | Friedrichs | 327/436 |
| 7,782,118 B2 | 8/2010 | Reichl et al. | 327/427 |

* cited by examiner

*Primary Examiner* — Lincoln Donovan
*Assistant Examiner* — Terry L Englund
(74) *Attorney, Agent, or Firm* — Keisling & Pieper PLC; David B. Pieper

(57) ABSTRACT

A direct drive cascode using a gate signal driven D-mode JFET connected in series with a power-enable-signal driven E-Mode JFET to provide a quick-operation high-temperature normally-off cascode configuration with low noise characteristics. The E-mode JFET may have the E-mode gate connected to ground with a pull down power element or resistor.

4 Claims, 7 Drawing Sheets

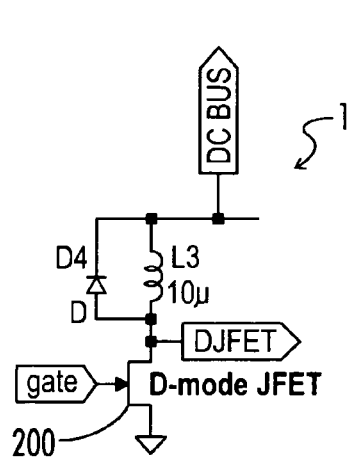
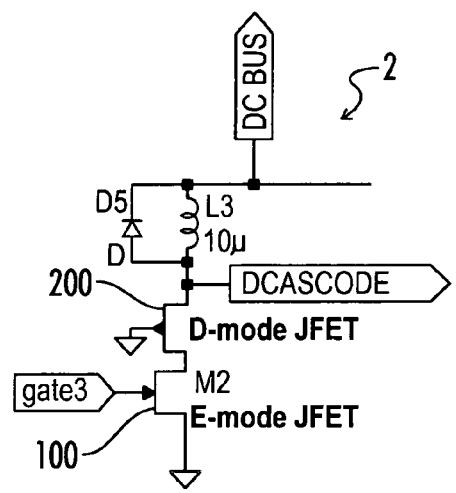
FIG. 1
(PRIOR ART)
FIG. 2
(PRIOR ART)

Transient behavior simulation results for the drain voltages of a SiC D-mode JFET, cascode, and direct drive cascode.

Direct drive cascode response to a gate driver power failure.

E-mode JFET drain-to-source voltage and differential gate-to-source voltage of the D-mode JFET in a direct drive cascode transient behavior after power failure Direct drive cascode response to a
gate driver power failure-steady state behavior.

E-mode JFET drain-to-source voltage and differential gate-to-source voltage of
the D-mode JFET in a direct drive cascode transient behavior after power failure

NORMALLY-OFF D-MODE DRIVEN DIRECT DRIVE CASCODE

CROSS-REFERENCE TO RELATED APPLICATIONS

This application claims priority of U.S. Provisional Patent Application 61/277,869, filed Sep. 30, 2009 entitled DIRECT DRIVE CASCODE, which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in cascode configurations. More particularly, the invention relates to improvements particularly suited for high temperature circuit environments requiring low noise and precise control.

2. Description of the Known Art

In high temperature environments, SiC JFETs have favorable characteristics. The simple JFET structure does not require a metal oxide layer at the gate so it is an attractive switch for high temperature applications. The two commercially available options, E-mode and D-mode SiC JFETs have different advantages and disadvantages for power electronics. D-Mode JFETs generally offer lower ON state resistance than similarly rated E-mode JFETS. However, D-mode JFETS are normally ON and this provides a disadvantage during power loss in the control modules. The E-Mode JFETs are the opposite with a normally OFF state, but present a higher ON state resistance than the D-Mode JFET. Additionally, the E-Mode devices also have a relatively low operational voltage range (approximately 3.5V) between the gate and source. This lower operational voltage translates into a lower signal to noise ratio that increases the possibility of power-switching noise corrupting the gate signal.

FIGS. 1 and 2 show prior art SiC JFET based switch positions under a clamp-inductive test setup. FIG. 1 shows a prior art Lone D-mode JFET switch position. It is known in the prior art how to use and drive a D-Mode JFET in this configuration. FIG. 2 shows a traditional cascode arrangement using an SiC D-mode JFET with an E-Mode JFET. Note how it is known to generate and provide a gate signal to the E-mode JFET but to then tie the gate of the D-Mode JFET to ground. This type of SiC cascode combines the high voltage blocking D-Mode SiC JFET with the normally-off characteristics of the E-Mode JFET to yield a high voltage normally-off power switch. However, this arrangement suffers from noise susceptibility at the gate and high voltage ringing at the gate terminal.

As will be appreciated by those skilled in the art, cascode circuits are known in various forms. Patents disclosing information relevant to cascode circuits include: U.S. Pat. No. 7,719,055 issued to McNutt, et al. on May 18, 2010 entitled Cascode Power Switch Topologies; U.S. Pat. No. 7,782,118, issued to Reichl, et al. on Aug. 24, 2010 entitled Gate Drive for Wide Bandgap Semiconductor Device; U.S. Pat. No. 6,614,281, issued to Baudelot, et al. on Sep. 2, 2003 entitled Method and Device for Disconnecting a Cascode Circuit with Voltage-Controlled Semiconductor Switches. Each of these patents is hereby incorporated by reference in their entirety. These patents fail to teach the advantages, method, or apparatus of the present invention.

U.S. Pat. No. 7,719,055 issued to McNutt, et al. on May 18, 2010 is entitled Cascode Power Switch Topologies. Its abstract reads as follows: A normally-off cascode power switch circuit is disclosed fabricated in wide bandgap semiconductor material such as silicon carbide or gallium nitride and which is capable of conducting current in the forward and reverse direction under the influence of a positive gate bias. The switch includes cascoded junction field effect transistors (JFETs) that enable increased gain, and hence blocking voltage, while minimizing specific on-resistance.

U.S. Pat. No. 7,782,118, issued to Reichl, et al. on Aug. 24, 2010 is entitled Gate Drive for Wide Bandgap Semiconductor Device. The abstract reads as follows: A gate drive circuit for a wide bandgap semiconductor junction gated transistor includes a gate current limit resistor. The gate current limit resistor is coupled to a gate input of the wide bandgap semiconductor junction gated transistor when in use and limits a gate current provided to the gate input of the junction gated transistor. An AC-coupled charging capacitor is also included in the gate drive circuit. The AC-coupled charging capacitor is coupled to the gate input of the wide bandgap semiconductor junction gated transistor when in use and is positioned parallel to the gate current limit resistor. A diode is coupled to the gate current limit resistor and the AC-coupled charging capacitor on one end and an output of a gate drive chip on the other end When in use, the diode lowers a gate voltage output from the gate drive chip applied to the gate input of the wide bandgap semiconductor junction gated transistor through the gate current limit resistor. The gate drive circuitry provides a small, efficient, and cost effective control circuitry for a wide bandgap semiconductor junction gated transistor.

U.S. Pat. No. 6,614,281, issued to Baudelot, et al. on Sep. 2, 2003 entitled Method and Device for Disconnecting a Cascode Circuit with Voltage-Controlled Semiconductor Switches. The abstract reads as follows: A method and an apparatus for turning off a cascode circuit comprising a series circuit formed by a low-blocking-capability and high-blocking-capability semiconductor switch, are described. When a turn-off command arrives, the gate voltage of the low-blocking-capability semiconductor switch is controlled in such a way that its drain voltage is held constant in the active range of the low-blocking-capability semiconductor switch. Consequently, an impermissible overvoltage at high potential of the cascode circuit at low potential is detected and actively limited. Each of these patents is hereby expressly incorporated by reference in their entirety.

From these prior references it may be seen that these prior art patents are very limited in their teaching and utilization, and an improved Normally-Off Direct Drive Cascode is needed to overcome these limitations.

SUMMARY OF THE INVENTION

The present invention is directed to an improved normally off D-mode driven direct drive cascode using a gate-signal-driven D-Mode JFET connected in series with an power-enable-signal-driven E-Mode JFET. This allows the E-Mode JFET to act as a circuit breaker to provide a quick-operation high-temperature normally-off cascode configuration with low noise characteristics. Advantages of the present invention include lower noise, and faster operation. In one embodiment, the E-Mode JFET may have the E-Mode gate connected to ground with a pull down power element or resistor. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 1 is a schematic view of a prior art D-Mode JFET circuit.

FIG. 2 is a schematic view of a prior art grounded D-Mode cascode circuit.

DETAILED DESCRIPTION OF THE INVENTION

Figure 3:
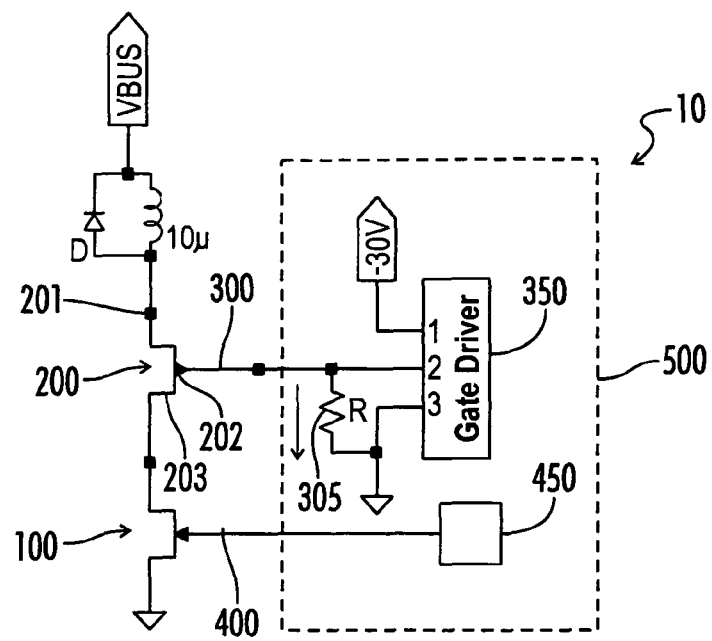
FIG. 3 is a schematic view of the normally-off direct driven D-Mode cascode circuit.
Figure 4:
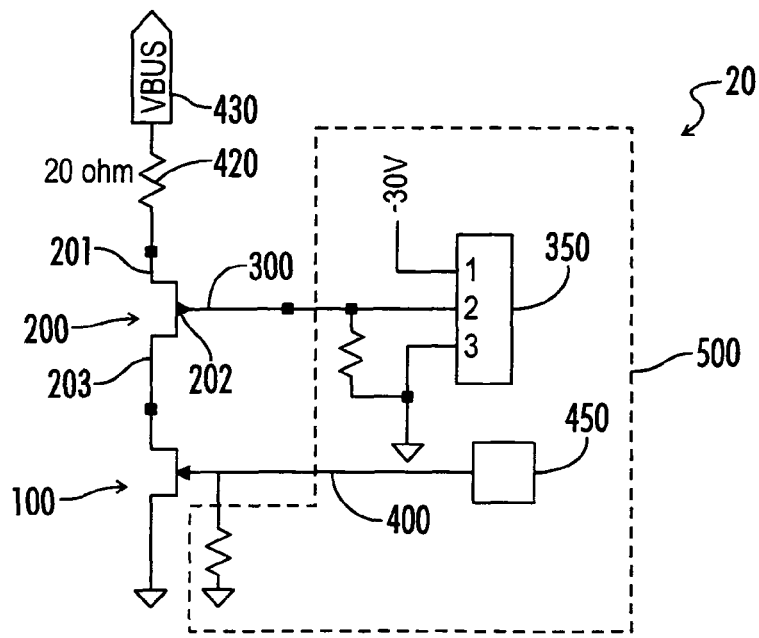
FIG. 4 is a schematic view of the normally-off direct driven D-Mode cascode circuit with a pull down resistor.

As shown in FIG. 3 of the drawings, one exemplary embodiment of the present invention is generally shown as a normally-off direct drive cascode 10. FIGS. 3 and 4 of the drawings show embodiments of the present invention with the switch position composed of an E-mode JFET 100 and D-Mode JFET 200 with a change in the driving signals using a gate signal 300 from the gate driver 350 to the D-mode JFET 200 and an enable signal 400 from the enable driver 450 to the E-mode JFET 100. The main difference between the prior art cascode configuration and the direct drive configuration of the present invention is the switching operation where the E-Mode JFET 100 switches the source of the D-Mode JFET 200, referred to as switched source. In this configuration, the E-Mode JFET 100 becomes an enabling device such that it acts like a static enable/disable switch. When the E-Mode JFET 100 is on, a gate drive signal 300 is placed across the gate terminal 202 of the D-Mode JFET 200 and the source terminal 203 of the E-mode JFET 100 to control the switching of the overall switch position. Conversely, when the E-Mode JFET 100 is off, this gate drive signal 300 cannot turn on the overall switch position. This means that in the event of a power loss to the enable driver 450 and gate driver 350, this new JFET based switch position will behave like a normally OFF switch in direct contrast to the prior art teachings. Additionally, this eliminates the noise-sensitive gate configuration of the prior art and the voltage oscillations associated with the prior art configuration.

Figure 5:
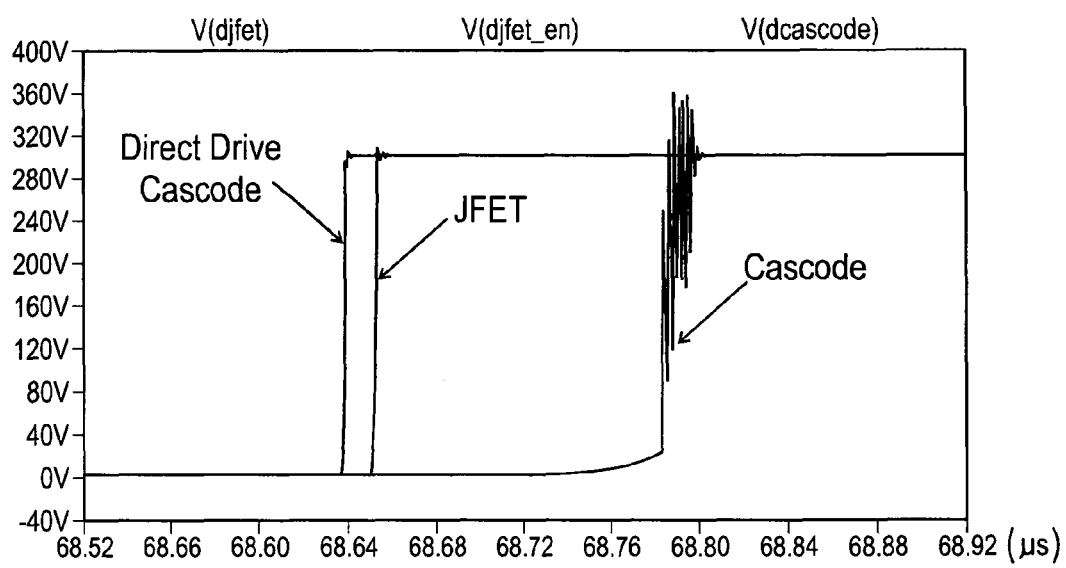
FIG. 5 is a transient behavior graph of drain voltages in circuits of FIGS. 1, 2, and 3.
Figure 6:
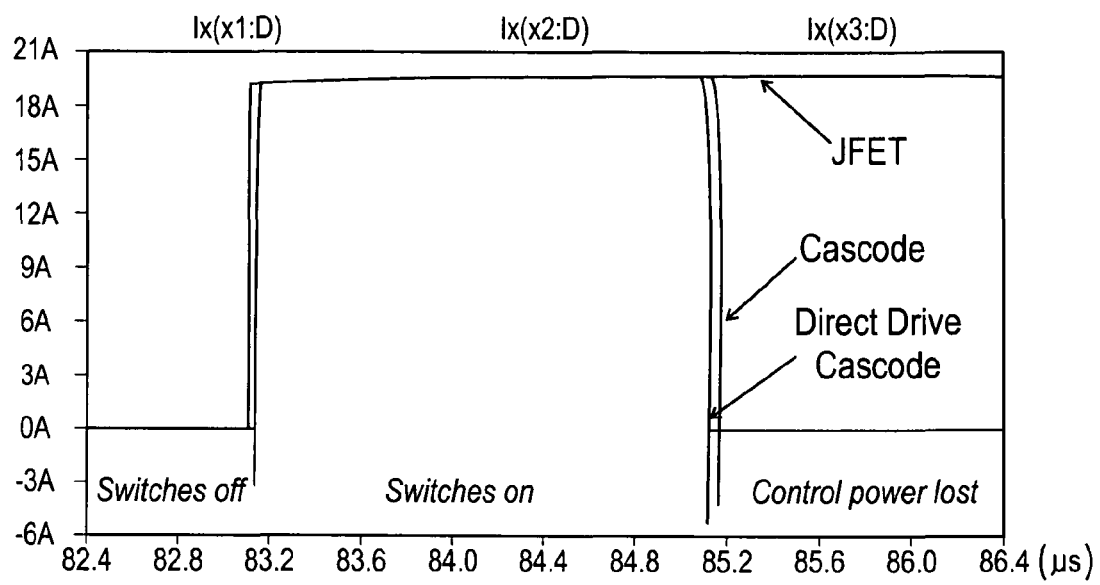
FIG. 6 is a transient behavior graph during off operation, on operation, and power loss in circuits of FIGS. 1, 2, and 3.

FIGS. 5 and 6 are presented to show how the present invention differences from the prior art configurations and to allow one to understand the unique advantages presented by the present configuration.

FIG. 5 shows simulation results displaying the drain voltages of the lone D-mode JFET 1 of FIG. 1, the cascode 2 of FIG. 2, and the direct drive cascode 10 of the present invention shown in FIG. 3. Note that there is virtually no difference between the JFET and the direct drive cascode performance in terms of switching noise. However, the cascode configuration of FIG. 2 presents a high level of voltage oscillation. This oscillation is due to the excitation of the increased parasitic characteristics associated with the E-mode and D-mode JFETs, in particular their respective Miller capacitances. Thus, the present invention provides significant advantages over the prior art.

FIG. 6 shows simulation results of the response to a control/gate driver power loss for the lone D-mode JFET 1 of FIG. 1, the cascode 2 of FIG. 2, and the direct drive cascode 10 of FIG. 3. The cascode 2 and the direct drive cascode 10 behave like any other normally off switch and stop conducting current after the voltage bias at the control terminals is lost. However, when the D-mode JFET device 1 loses the voltage bias at the gate terminal and it keeps conducting current due to its normally-on behavior.

Ideally for the direct drive cascode 10, a low voltage, high current E-mode device 100 would be deployed. The E-mode device 100 in the direct drive configuration would act as a solid state circuit breaker. It is turned on once the control signals 300 at the gate 202 of the D-mode JFET 200 are established. During normal switching operation, the E-mode JFET 100 remains on while the D-mode JFET 200 is switched. The E-mode JFET 100 is there to enable a safe "off state mode" in case power is lost at the control block 500.

FIG. 3 shows a direct drive cascode 10 where the gate driver 350 is powered (−30 v) during normal operation. In the event of a power loss at the control section 500, the "enable" voltage 400 falls to zero, turning the E-mode JFET 100 off. The gate driver 350 will cease operation possibly leaving the gate signal 300 connected to high impedance node. The gate signal 300 node needs to be connected to ground in order for the dmode gate 202 to dmode source 203 voltage to be negative. To ensure that the dmode gate 202 will connect to ground, a resistor R 305 can be added. This would be the ideal operation of the direct drive cascode during control loss of power.

FIG. 4 is a simplified version of a direct drive cascode switch position 20 and accompanying gate driver 350, and enable driver 450. FIG. 4 also shows the resistive load 420 and voltage source 430 (Vbus) arrangement implanted for experimental testing. For the test setup, the D-mode device 200 is a 1200V/30A SiCED JFET. The E-mode device 100 is a 1200V/15A SJEP120R125 SEMISOUTH JFET. The gate driver 350 uses a 15 kHz switching frequency and the load resistor bank 420 was at 20 Ohm. The maximum Vbus 430 voltage was 200V. The limiting factor for higher voltage was the wirebond size of the in-house packaged E-mode JFET 100. The wirebond size used had an approximate 10A current limit, thus regulating the voltage to a maximum 200V based on the 20 Ohm load.

The direct drive cascode gate driver 350 was powered from a single power supply and the control signal fed from a signal generator. The test was carried out first by establishing normal switching operation and subsequently simulating a control block 500 power failure. In order to establish normal switching operation, a +3.3 V signal is applied at the Enable signal node 400, and the external control signal (from 0V to 5V) is translated into a −30V to 0V signal and applied to the dmode gate node 202. To simulate a gate driver power failure, the power supply powering the gate driver 500 portion was manually turned off.

Figure 7:
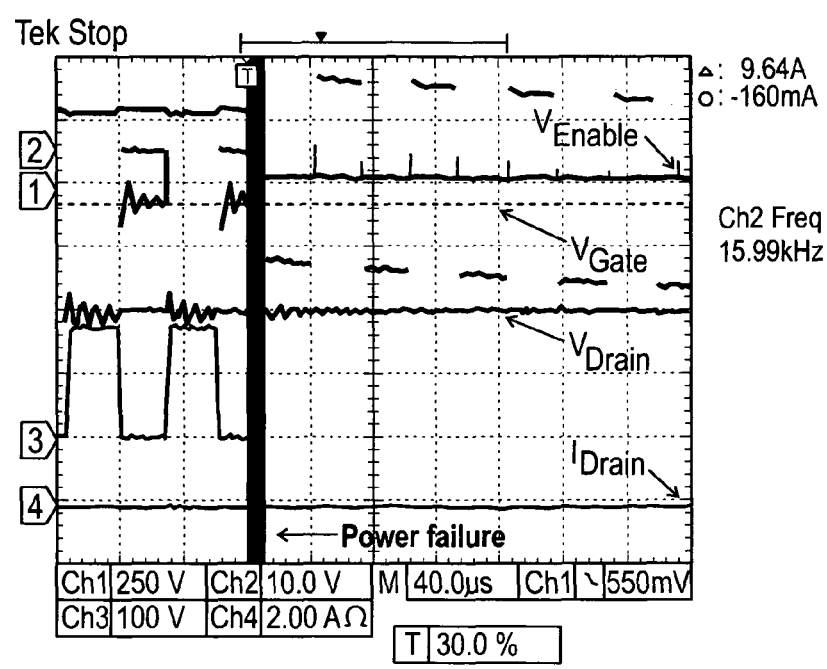
FIG. 7 is an oscilloscope of the power failure in the circuit of FIG. 4.

FIG. 7 shows an oscilloscope capture of the direct drive cascode 20 behavior during a control block 500 power failure. For all the signals shown in the FIGS. 7 through 10, refer to the FIG. 4.

Before power failure, FIG. 7 shows the direct drive cascode 20 in normal operation with the voltage at the enable signal 400 at +3.3 V, voltage at the gate signal 300 switching from 0 V to approximately −30 V, voltage at drain 201 alternating from 0 V to 200 V and, current at drain 201 alternating from 0 A to approximately 10 A. Subsequently, the power failure is induced by manually turning off the power supply powering the control block 500. Note that the manual interruption of the control block 500 power supply introduces mechanical 'bouncing' as can be observed from FIG. 6. Once the power failure has occurred and mechanical bouncing has subsided, voltage at the enable signal 400 falls to 0 V turning the E-mode device 100 off. Voltage at the dmode drain 201 rises to 200 V while current at the drain 201 falls to 0 A. Since the gate driver 350 was being powered independently of the control block 500, voltage at the gate 202 continues to switch thanks to energy stored in the output capacitors across the gate driver 350 output stage. The voltage at the gate 202 switching eventually secedes once the output capacitors have been drained out of energy.

Figure 8:
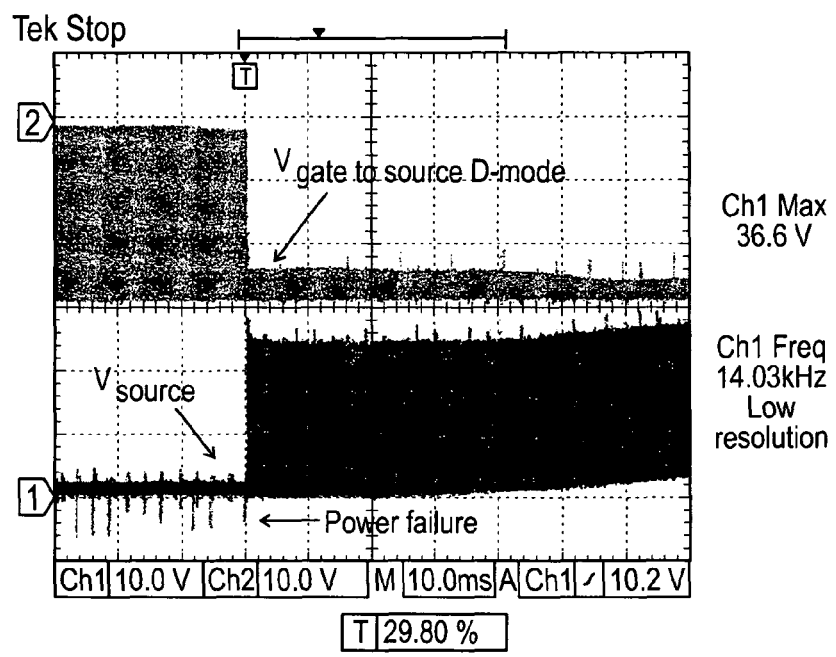
FIG. 8 is an oscilloscope of the before and after power failure in the circuit of FIG. 4 showing E-mode drain to source voltage and D-mode gate to source voltage.

FIG. 8 shows the voltage at the source 203 as well as the differential gate 202-to-source 203 voltage of the D-mode JFET 200 during the power failure. As can be observed from FIG. 8, the differential gate-to-source voltage of the D-mode JFET 200 is immediately brought down to a negative voltage (approximately −23 V). This effectively turns off the D-mode JFET 200. It is important to note that the maximum registered voltage during failure response across the E-mode JFET 100 (Vsource) is just 35.1 V. This means that the low E-mode JFET 100 never sees the full Vbus 430 voltage. Once the E-mode JFET 100 is turned off due to a power failure, the D-mode JFET 200 subsequently gets turned off; thus blocking the majority of the bus-voltage 430.

The switching voltage signal appearing at the source node 203 after power failure is associated with the voltage at the gate 202 which continues to switch due to energy stored in the output capacitors of the gate driver 350 that was used. However, note that this voltage is not switching the D-mode JFET 200 on and off as it is evident from looking at the differential gate-to-source voltage of the D-mode JFET 200. This is also corroborated in FIG. 6 where current at the drain 201 is immediately brought down to 0 A and voltage at the drain 201 is brought up to full bus voltage 430 simultaneously.

Figure 9:
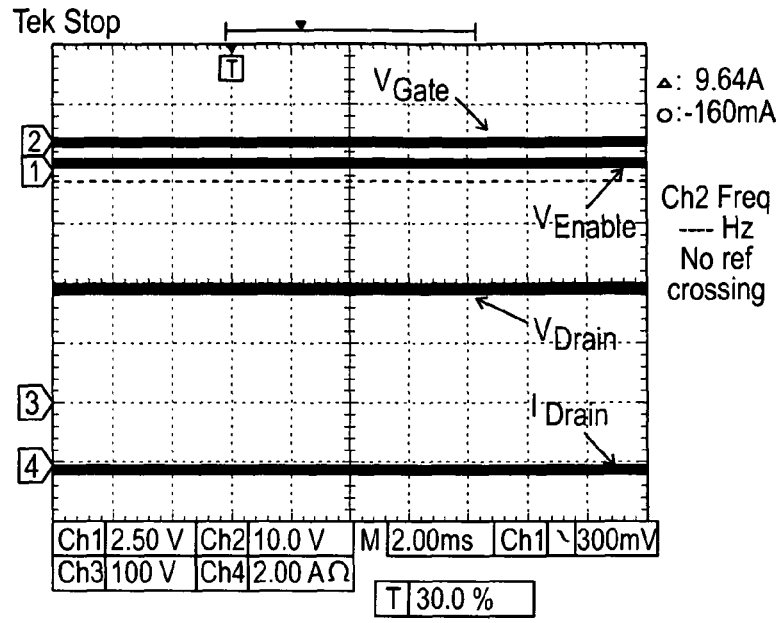
FIG. 9 is an oscilloscope of the steady state behavior after power failure in the circuit of FIG. 4.

FIG. 9 shows the direct drive cascode 20 steady state behavior after a failure. In this oscilloscope capture, voltage at the enable signal 400 remains at 0 V keeping the E-mode device 100 off. Voltage at the drain 201 remains at 200 V while current at the drain 201 remains at 0 A. Voltage at the gate 202 has now fallen to 0 V.

Figure 10:
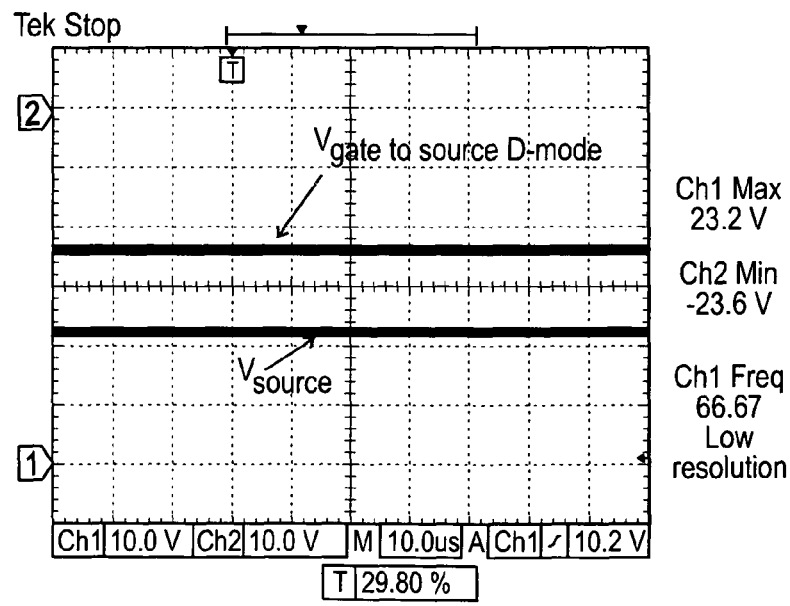
FIG. 10 is an oscilloscope of the steady state behavior after power failure in the circuit of FIG. 4.

FIG. 10 shows the voltage at the source 203 as well as the differential gate-to-source voltage of the D-mode JFET 202 after a gate driver 500 power failure. The differential gate-to-source voltage of the D-mode JFET 202 has settled to approximately −23.6 V (the turn off voltage for the device). Voltage at the source 203 has settled to approximately 23 V, which is keeping the D-mode JFET 200 off.

Thus, the direct drive cascode concept has been experimentally validated. The benefits of using this approach include having a switch position with the ability to operate at really high temperatures by using SiC JFETs exclusively. Safe, normally off, behavior is inherent while avoiding the high noise levels found in a traditional cascode switch position (i.e., a large area E-mode device can be implemented).

The direct drive cascode switch harnesses the normally-off characteristics of the traditional cascode while simultaneously retaining the "clean", fast transient characteristic of a single D-mode JFET. A drawback of the direct drive approach is the added losses related to the E-mode JFET when compared to the single D-mode JFET switch position. But unlike the traditional cascode, a very low on resistance E-mode JFET can be achieved without introducing the increased capacitive parasitics derived from a larger device into the dynamic behavior. The increased capacitive parasitics are effectively absent when the E-mode device is turned on under normal operation for a direct drive cascode.

Reference numerals used throughout the detailed description and the drawings correspond to the following elements:
lone D-mode JFET 1
cascade JFET 2
normally-off direct drive cascode 10
resistor drain circuit direct drive cascade switch 20
E-mode JFET 100
dMode JFET 200
dmode drain 201
dmode gate terminal 202
dmode source 203
gate signal 300
gate driver 350
enable signal 400
resistive load 420
voltage source 430
enable driver 450
control block 500

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A direct drive cascade apparatus for use with a power input and a ground, comprising:
    a power signal generator electrically connected to the power input and ground, the power signal generator outputting a gate control signal and a power enabled signal, the power enabled signal corresponding to the power input;
    a dmode junction gate field effect transistor, with a dmode gate, the dmode gate connected to the gate control signal; and
    an emode junction gate field-effect transistor, series connected with the dmode junction gate field effect transistor with an emode gate, the emode gate connected to the power enabled signal.

2. The apparatus of claim 1, the power signal generator further comprising:
    a resistor connected between the dmode gate and ground.

3. The apparatus of claim 1, the power signal generator further comprising:
    a resistor connected between the emode gate and ground.

4. A method for controlling a direct drive cascode for use with a power input and a ground, comprising:
    providing a gate control signal;
    providing a power enabled signal corresponding to the power input;
    providing a series connected dmode junction gate field effect transistor and emode junction gate field effect transistor;
    controlling the dmode junction gate field effect transistor with the gate control signal; and
    controlling the emode junction gate field-effect transistor with the power enabled signal.

* * * * *